United States Patent [19]
Lin et al.

[11] Patent Number: 5,286,667
[45] Date of Patent: Feb. 15, 1994

[54] MODIFIED AND ROBUST SELF-ALIGNING CONTACT PROCESS

[75] Inventors: Jiunn-Jyi Lin, Hsinchu; Lih-Shyng Tsai, Hsin-chu; Hsien-Wen Chang; Chang-Tai Chiao, both of Hsinchu, all of Taiwan

[73] Assignee: Taiwan Semiconductor Manufacturing Company, Hsinchu, Taiwan

[21] Appl. No.: 925,453

[22] Filed: Aug. 11, 1992

[51] Int. Cl.⁵ .................................... H01L 21/82
[52] U.S. Cl. .................................. 437/52; 437/47; 437/60; 437/913; 437/919
[58] Field of Search ............. 437/40, 47, 52, 60, 437/913, 919

[56] References Cited

U.S. PATENT DOCUMENTS

| | | | |
|---|---|---|---|
| 4,183,040 | 1/1980 | Rideout | 357/41 |
| 4,704,368 | 11/1987 | Goth et al. | 437/60 |
| 4,990,980 | 2/1991 | Wada | 357/23.6 |
| 5,001,078 | 3/1991 | Wada | 437/52 |

Primary Examiner—Olik Chaudhuri
Assistant Examiner—Richard A. Booth
Attorney, Agent, or Firm—George O. Saile

[57] ABSTRACT

The method is described for fabricating an integrated circuit having a combination of a capacitor and metal oxide semiconductor field effect transistor with gate electrodes and source/drain regions. The method features the use of silicon nitride or silicon oxynitride barrier layers. The barrier layer is a key to the successful lightly doped drain spacer etch process. The barrier layer aids in endpoint detection for the plasma etch. This allows for less loss of the field oxide and greater thickness control of the field oxide regions. Further, the silicon nitride endpoint detection allows for the removal of undesirable residual silicon oxide from the surface of the capacitor plate without loss of the polysilicon capacitor plate itself.

13 Claims, 7 Drawing Sheets

MODIFIED AND ROBUST SELF-ALIGNING CONTACT PROCESS

BACKGROUND OF THE INVENTION (1) Field of the Invention

The invention relates to the fabrication of integrated circuit devices, and more particularly, to a method of improved etching in the fabrication of integrated circuits.

(2) Description of the Prior Art

In the prior art, there are many problems which relate to thickness loss or damage to the various silicon oxide layers used in a large scale integration semiconductor process of today. For example, the isolation oxide layer on polysilicon layers sustains substantial damage during conventional plasma etching steps. Further, there is poor endpoint detection stability and repeatability of lightly doped drain (LDD) spacer and isolation layer plasma etch process. There is poor silicon oxide thickness control of LDD spacer and isolation layer plasma etch process. Also, there is poor stability of oxide removal process on capacitor polysilicon area. The isolation oxide layer may be damaged on self-aligned contact plasma etch.

Other workers in the field have encountered the above problems. U.S. Pat. No. 4,963,502 attempts to overcome similar, but different problems using silicon nitride spacer and caps over their polysilicon gate structure. U.S. Pat. No. 4,988,643 M. H. Tsou shows the use of silicon nitride cap over the polysilicon gate material to prevent oxidation of the gate electrode.

SUMMARY OF THE INVENTION

A principal object of the present invention is to provide an effective and robust method of self-aligned contact etching which prevents much of the damage to the silicon oxide layers as used in the prior art.

A further object of the invention is to provide such a robust method that uses silicon nitride or oxynitride barrier layer before a polysilicon lithography and etching procedure.

In accordance with the objects of this invention a new method of self-aligned contact etching is achieved. The key of the present invention is the addition of a silicon nitride or silicon oxynitride barrier layers.

The method of fabricating a combination of a capacitor and a metal oxide semiconductor field effect transistor with gate electrodes and source/drain regions integrated circuit using such barrier layers first involves providing field oxide regions formed on a silicon substrate to isolate surface regions of silicon from one another and the regions leaving one conductivity. A doped polysilicon layer is deposited on top of the field oxide regions and the isolated surface regions. A first silicon oxide layer is formed on top of the doped polysilicon layer. A first silicon nitride barrier layer is deposited on top of the silicon oxide layer. An opening having substantially vertical sidewalls is formed through the first silicon nitride layer and first silicon oxide layer to the polysilicon layer in the planned capacitor. The gate electrode is formed on the surface regions and the pattern of the capacitor on the field oxide regions by etching openings in the silicon oxide, silicon nitride, and polysilicon layers using lithography mask. Ion implanting lightly doped source/drain regions of an opposite conductivity into the surface regions of silicon having said one conductivity is done. A second layer of silicon dioxide is deposited over the exposed surfaces. The second silicon dioxide layer is anisotropically etched to form spacers on the substantially vertical sidewalls whereby the silicon nitride barrier layer aids in etch endpoint detection. A polysilicon oxide layer is grown on top of the exposed polysilicon layer to form plate of said capacitor. Ions of opposite conductivity impurities are implanted into the surface regions of silicon to form heavily doped source/drain regions adjacent to the gate electrode. A second barrier layer of silicon nitride is deposited over the exposed surfaces. A layer of dielectric material is deposited over the second silicon nitride layer. Openings are formed through the layer of dielectric material in all areas but the that which covers the planned capacitor. The remaining exposed second silicon nitride layer is etched away to expose said source/drain regions. The remains of the dielectric material covering the capacitor is removed. The dielectric of the capacitor is formed. A metal layer is deposited and patterned to form the top metal electrode of said capacitor and contacts to said source/drain regions of said integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1:
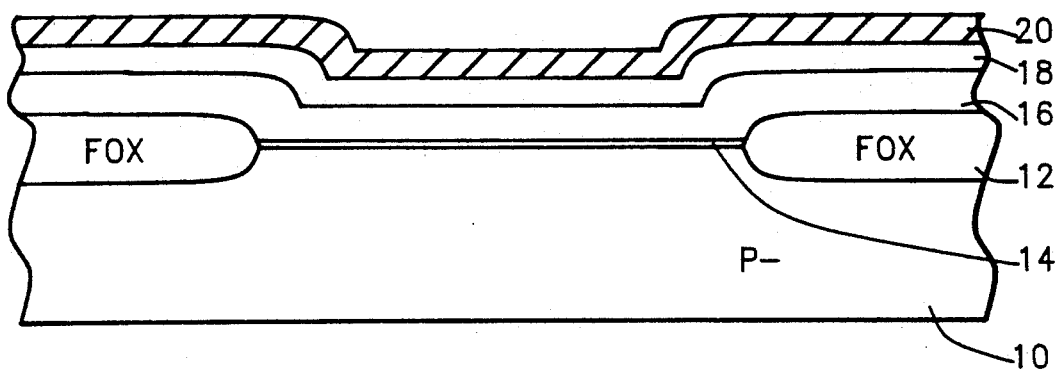
FIGS. 1 through 11 schematically illustrate in cross-sectional representation one preferred embodiment of this invention.

Referring now more particularly to FIG. 1, there is shown an illustration of the N channel portion of a partially completed, CMOS metal oxide field effect transistor (MOSFET) and capacitor. The semiconductor substrate 10 is preferably composed of silicon having a (100) crystallographic orientation. In an effort to simplify the description and the drawings the dielectric isolation between devices has been only partially shown and will not be described in detail, because they are conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field OXide pattern, FOX 12. Then semiconductor devices can be provided in the silicon mesas according to the following processes.

The surface of the silicon substrate 10 is thermally oxidized to form the desired gate oxide 14 thickness. The preferred thickness is between about 70 to 200 Angstroms.

The polysilicon layer 16 is deposited by low pressure chemical vapor deposition (LPCVD) using silane to a thickness of between about 2000 to 5000 Angstroms. The layer 16 can be doped in situ or doped after its deposition. The undoped polysilicon layer 16 can be doped with phosphorus oxychloride at a temperature of about 900° C. Alternatively, in situ doping or implanted doping with phosphorus, boron, or arsenic can be used.

Silicon oxide layer 18 is deposited to a thickness of between about 500 to 2700 Angstroms followed by the deposition of a barrier layer of silicon nitride or silicon oxynitride 20 to a thickness of between about 300 and 3000 Angstroms. The preferred deposition process for the silicon oxide is TEOS at 650° to 800° C. The preferred deposition process for the silicon nitride is LPCVD with $NH_3$ and silane gas at 700° to 850° C. The combined thickness of layers 18 and 20 should be between about 2000 to 5000 Angstroms. For silicon oxynitride, the preferred deposition process is plasma-enhanced chemical vapor deposition (PECVD) using silane and oxygen and nitrogen sources.

Figure 2:
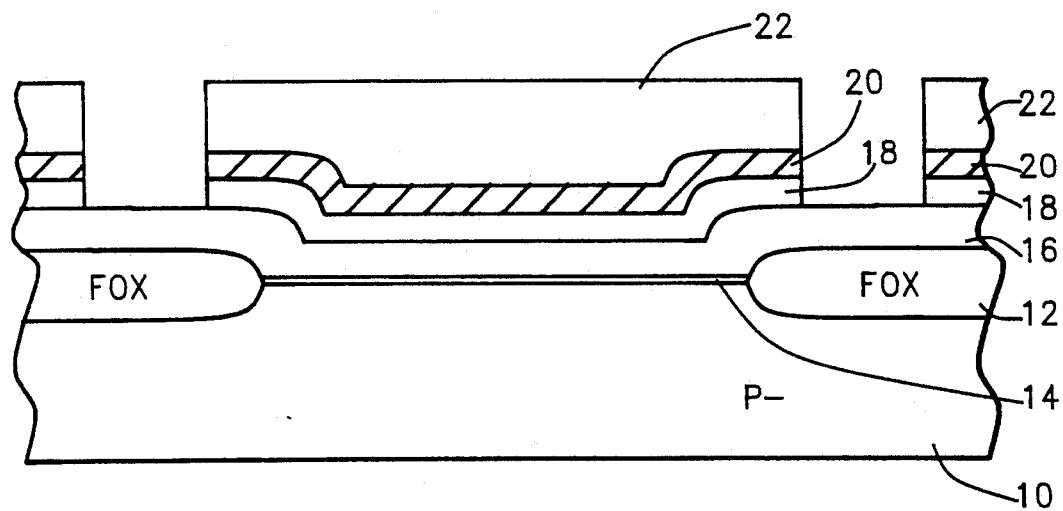

Referring to FIG. 2, layers 20 and 18 are anisotropically etched using a resist mask layer 22. The etching is done in the planned area of the plate of the capacitor. The polysilicon layer 16 which will be the capacitor plate is exposed by the etching. The preferred etchant used is $HBr/Cl_2/He$ at a pressure of 200 to 500 mTorr and power of 300 to 500 Watts.

Figure 3:
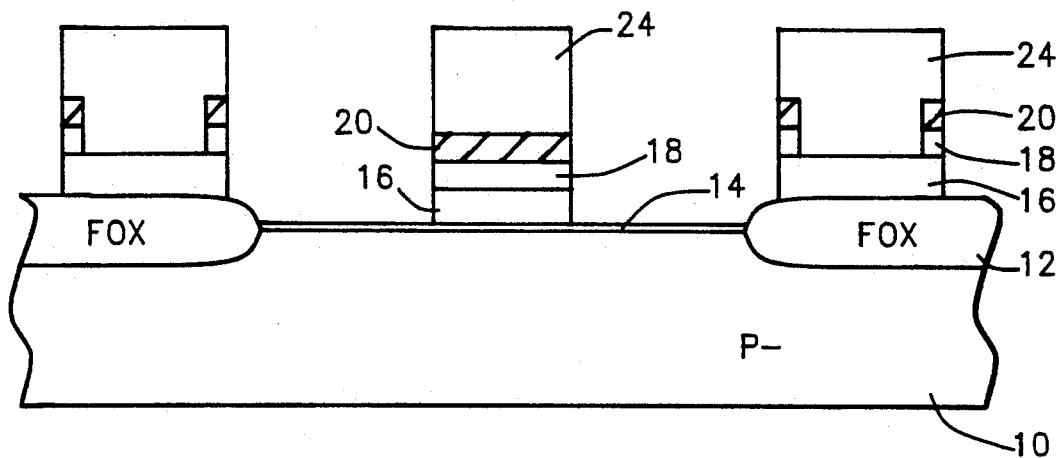

The layers 16, 18 and 20 are patterned by conventional lithography using resist mask 24 and anisotropic etching techniques as are conventional in the art to provide a desired pattern of gate electrodes and structures for the planned capacitor on the FOX 12 surfaces or elsewhere as seen in FIG. 3. The sidewalls of these structures substantially vertical. Note that a portion of the first silicon nitride layer 20 remains in the capacitor area and over the polysilicon gate electrode. The resist layer 24 is removed by conventional plasma stripper and wet chemicals, for example, $H_2SO_4$ and $He_2O_2$.

Figure 10:
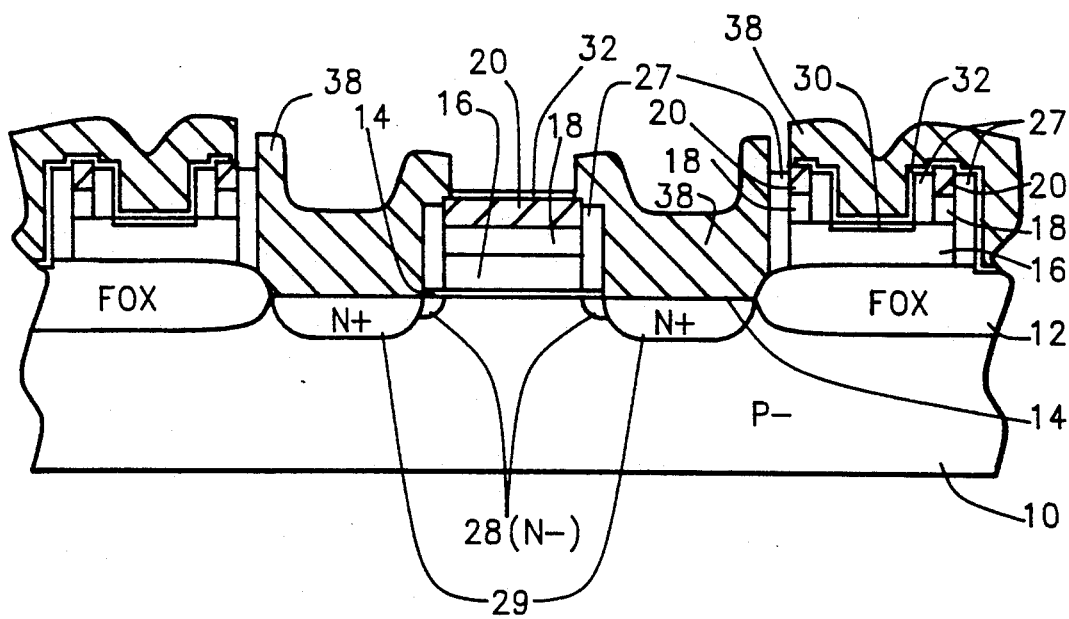
Figure 11:
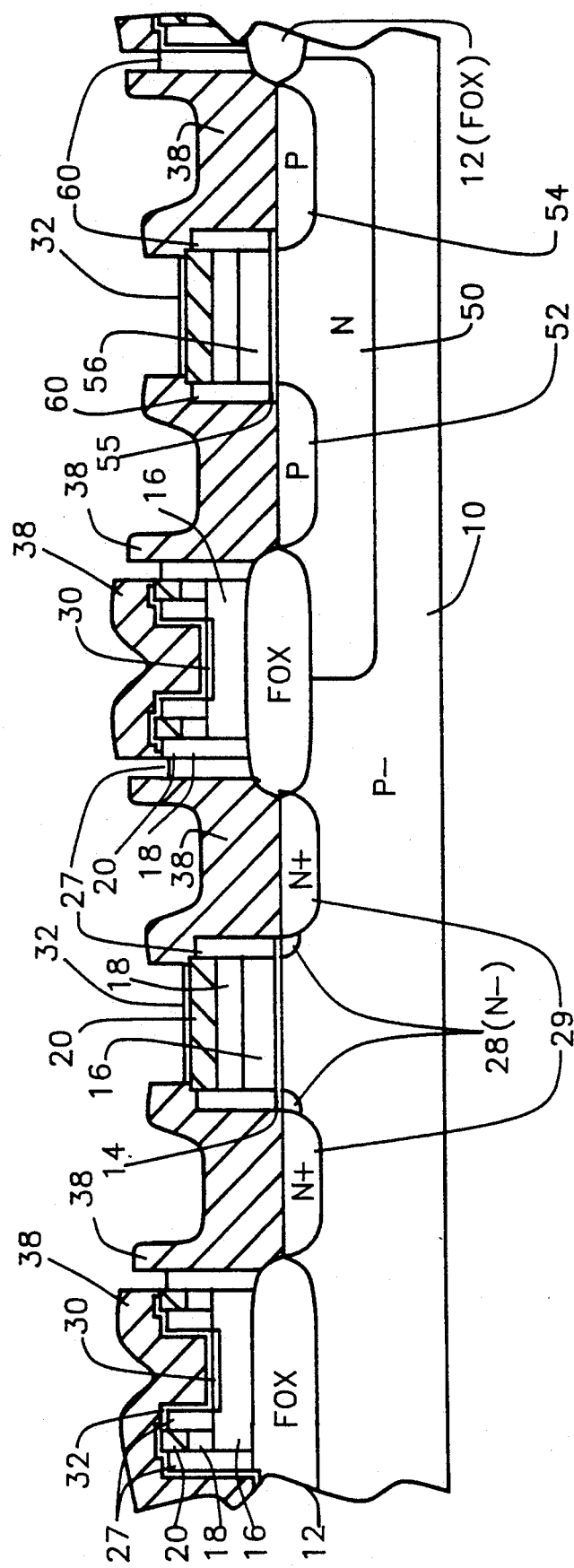

The source/drain structure of the MOS FET may now be formed. FIGS. 1 through 10 show only the N channel MOSFET portion of a CMOS integrated circuit device. It is well understood by those skilled in the art that the P channel portion can be formed by simply substituting opposite polarities to those given for the N channel embodiment. The N well is used for the P channel device. Resist masking is used to prevent unwanted impurities from reaching the device structures being fabricated. FIG. 11 shows both the NMOS and PMOS portions of the CMOS as well as the capacitor of the integrated circuit device embodiment.

Figure 4:
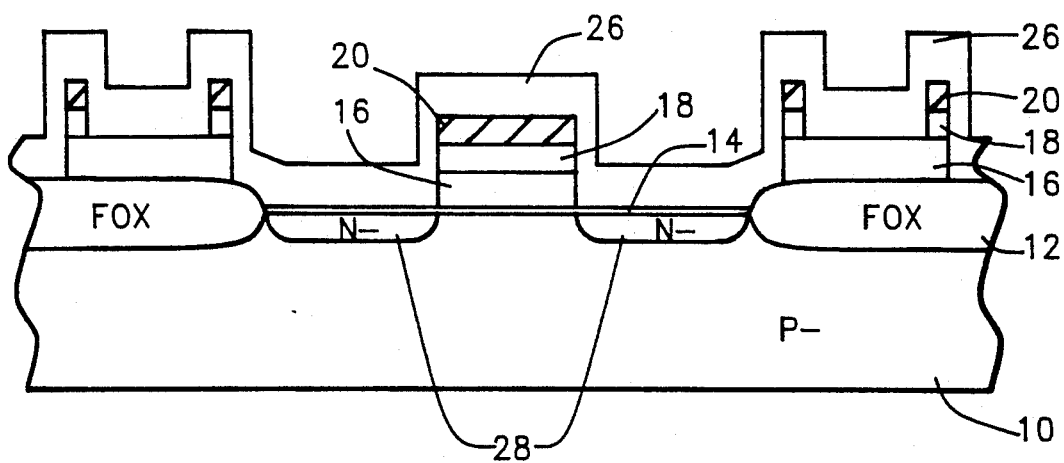

Referring now to FIG. 4, the lightly doped drain (LDD) N- regions are ion implanted. The typical dopant concentration for the regions 28 is P31 at 3E13 atoms/$cm^3$.

Figure 5:
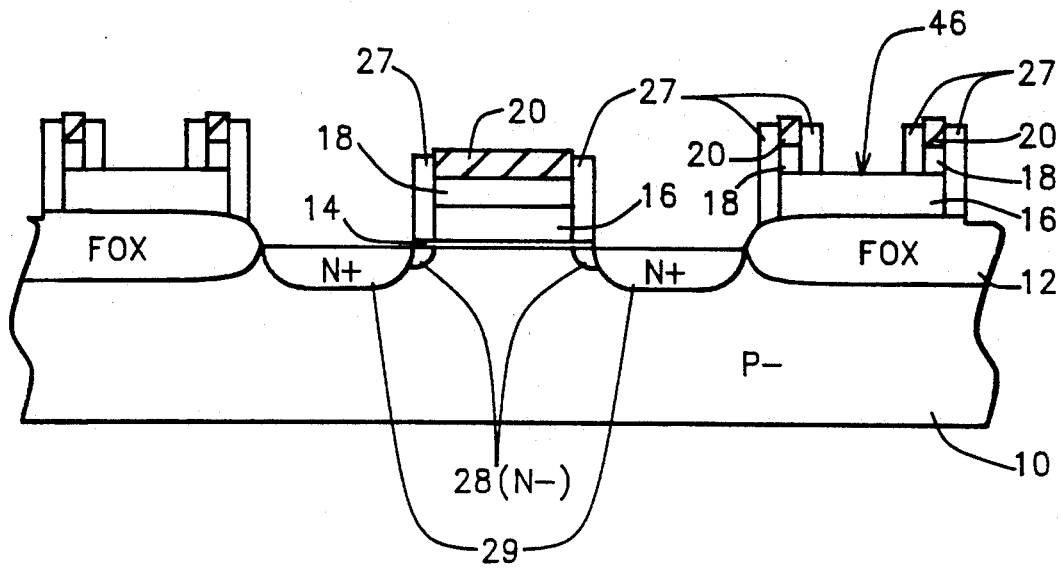

A second layer of silicon dioxide 26 is blanket deposited to a thickness of between about 500 to 3000 Angstroms over the wafer's exposed surfaces. This layer 26 is etched to form spacers 27 on both the gate electrode structures and the capacitor structures, as illustrated in FIG. 5. The silicon nitride or silicon oxynitride barrier layer 20 is a key to the successful LDD spacer etch process. This barrier layer aids in endpoint detection for the plasma etch. This allows for less loss of field oxide 12 and greater thickness control of the FOX 12. Another important feature of the present invention is that the silicon nitride endpoint detection allows for the removal of undesirable residual silicon oxide 26 from the surface 46 of the capacitor plate 16 without loss of the polysilicon capacitor plate itself. It is important that no silicon oxide remains on the capacitor plate. The plasma etching ambient is $CF_4/CHF_3/Ar$ at a pressure of 500 to 800 mTorr and power of 400 to 600 Watts. An optical emission detector is used to detect the end of tile etching process.

The LDD source/drain regions are completed by the ion implantation of N+ ions, such as phosphorus or arsenic to form the heavily doped regions 29, as shown in FIG. 5. The preferred dopant concentration for these regions 29 is about 2 to 5E15.

Figure 6:
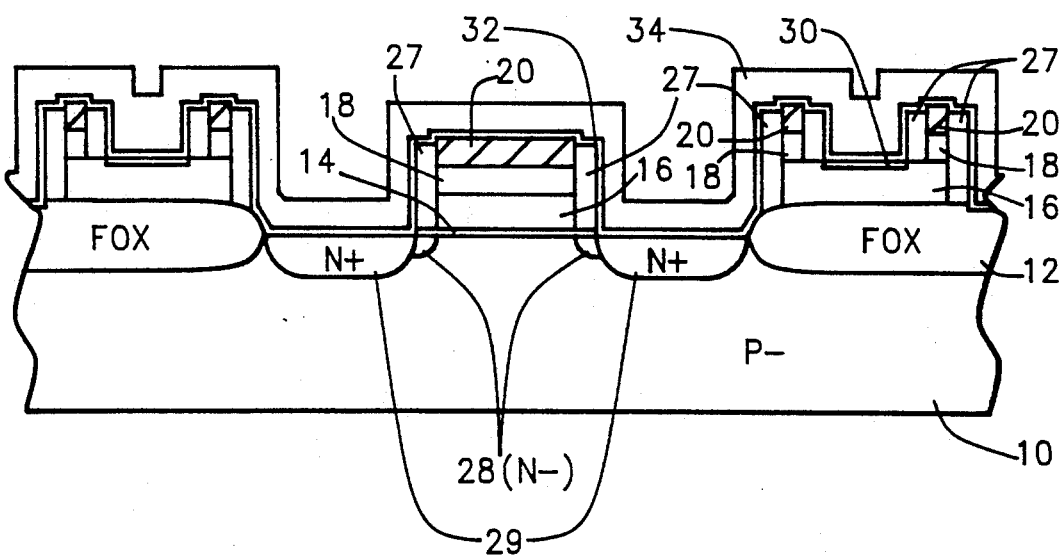

Referring now to FIG. 6, a polysilicon oxide layer 30 is grown on top surface of the capacitor plate 16 to a thickness of between about 100 to 700 Angstroms. This layer serves as the capacitor dielectric. Silicon oxide is also grown on the exposed silicon surface regions. The thermal growth process is in a wet oxygen ambient at about 900° C.

A second barrier layer of silicon nitride or silicon oxynitride 32 is deposited to a thickness of between about 100 to 700 Angstroms. The preferred deposition process is silane and $NH_3$ at 700° to 850° C.

Next, a layer of dielectric material, such as borophosphosilicate glass (BPSG) 34 is deposited over the wafer to a thickness of between about 2000 to 7000 Angstroms. This layer could be deposited by LPCVD, PECVD, or atmospheric pressure chemical vapor deposition (APCVD) with 1 to 5% by weight boron and 2 to 6% by weight phosphorus.

Figure 7:
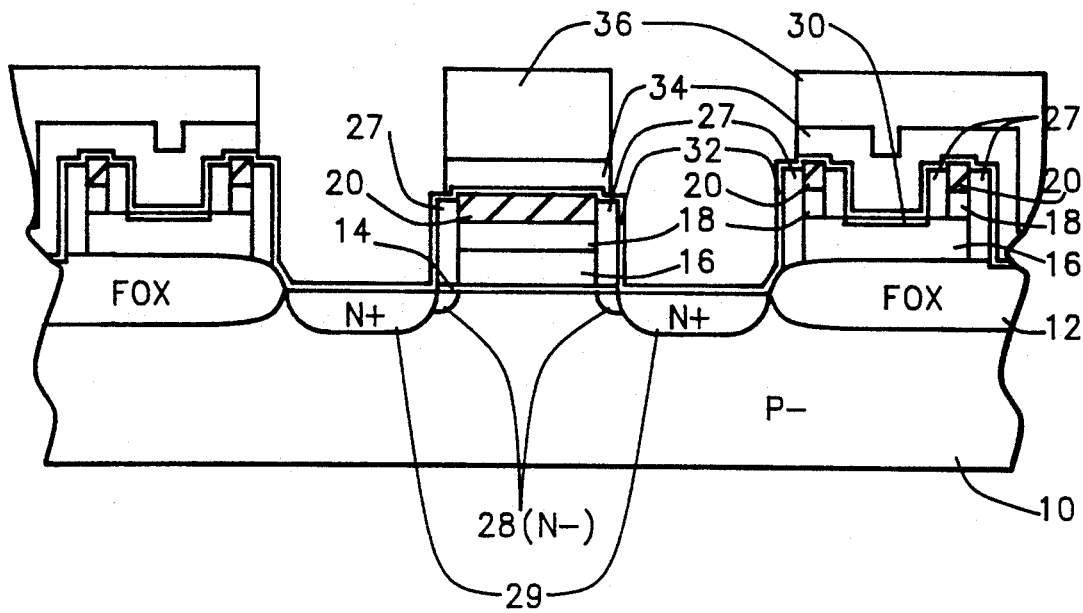
Figure 8:
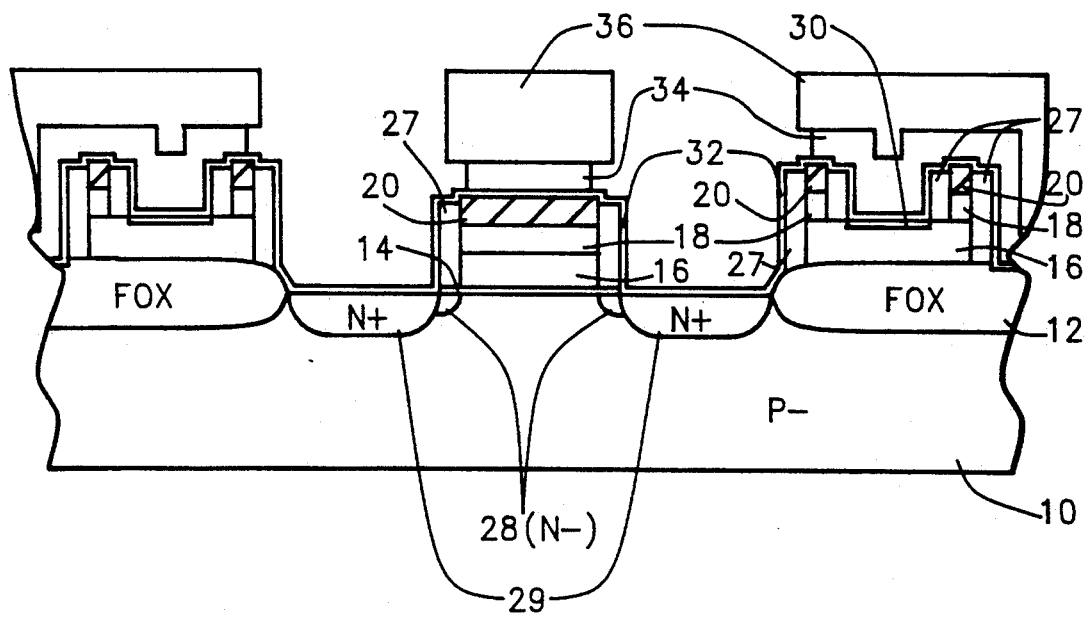
Figure 9:
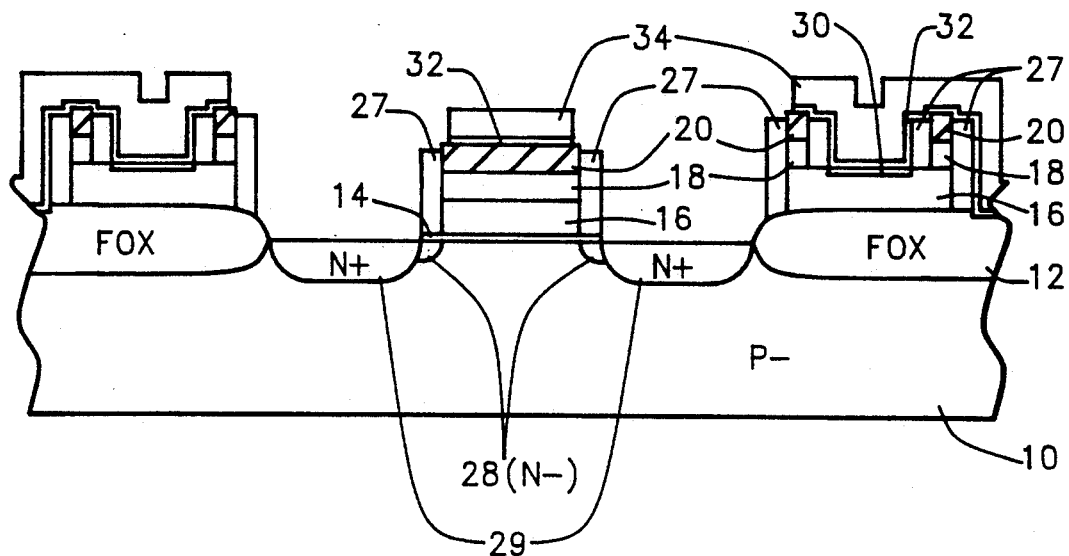

A layer of photoresist is deposited over the wafer, followed by its exposure and development, dry and wet etching resulting in FIG. 8 structure. The resist mask layer is represented by 36. FIG. 7 shows the etching result after the use of a wet etching step using conventional buffered etching at a temperature of 20° to 30° C. The dry etching ambient is $CF_4/CHF_3/Ar$ at a pressure of 400 to 800 mTorr and power of 300 to 600 Watts. Note that the second silicon nitride layer 32 is used as the barrier wet etch stop for this etching process. If this dielectric barrier nitride is not used, the spacer isolation layer 25 would be etched out. This would cause a short from the metal to the polysilicon gate. Also, there is an undercutting effect in the dielectric layer 34 caused by the wet etching process. More misalignment is allowed in this process due to the presence of two layers of silicon nitride or silicon oxynitride, 20 and 32.

A contact etch removes the residual silicon nitride or silicon oxynitride. The etching ambient is $SF_6/O_2/He$ at a pressure of 200 to 500 mTorr and power of 150 to 400 Watts. The resist mask 36 is removed by conventional etching process resulting in the FIG. 9 structure.

The capacitor formation is completed with the masking of the non-capacitor areas and removal of the dielectric layer 34 by wet etching using BHF under a temperature of 20° to 30° C. The silicon nitride layer 32 now forms the capacitor dielectric. There is no need for further processing of the capacitor dielectric.

A metal layer 38 composed of an aluminum alloy, aluminum-silicon-copper or Ti/TiW/AlCuSi is deposited by sputtering, vacuum evaporation or the like processes. The metal layer is then patterned by lithography and etching techniques to form the top capacitor electrode and the contacts to the source/drain regions. The complete structure is illustrated in FIG. 10.

FIG. 11 illustrates both the NMOS and PMOS of the CMOS transistor along with the capacitor of the completed integrated circuit device of the present invention. The N-well 50 is formed by conventional methods. The lightly doped drains 52 and 54 are formed. The gate dielectric 55, gate electrode 56, and spacers 60 are formed as described for the FTMOS portion above.

The following Examples have been included to show the important features of the invention and to aid in the understanding thereof. Variations may be made by one skilled in the art without departing from the spirit and scope of the invention.

EXAMPLE 1

The following table illustrates the conventional process results compared to the results of the cap silicon nitride process of the present invention. The conventional process does not use a silicon nitride cap while the cap nitride process of the present invention does use a silicon nitride cap 20 during the reactive ion anisotropic etching of layer 26 to produce sidewall spacers 27. FIG. 4 shows the structure before etching and FIG. 5 shows the structure after etching where silicon nitride cap 20 was used.

TABLE 1

| Spacer | Endpoint Signal | Spacer Width | TEOS Loss | FOX Loss |
|---|---|---|---|---|
| Normal | flat drop | 0.23 um | 700 A | 500 A |
| CAP NITRIDE | slope drop | 0.25 um | none | 220 A |

A major advantage of the cap nitride process is that the spacer/isolation oxide layer 26 can be removed completely at the capacitor areas with lower thickness loss of layers 20, 18, and 12.

EXAMPLE 2

Figure 12:
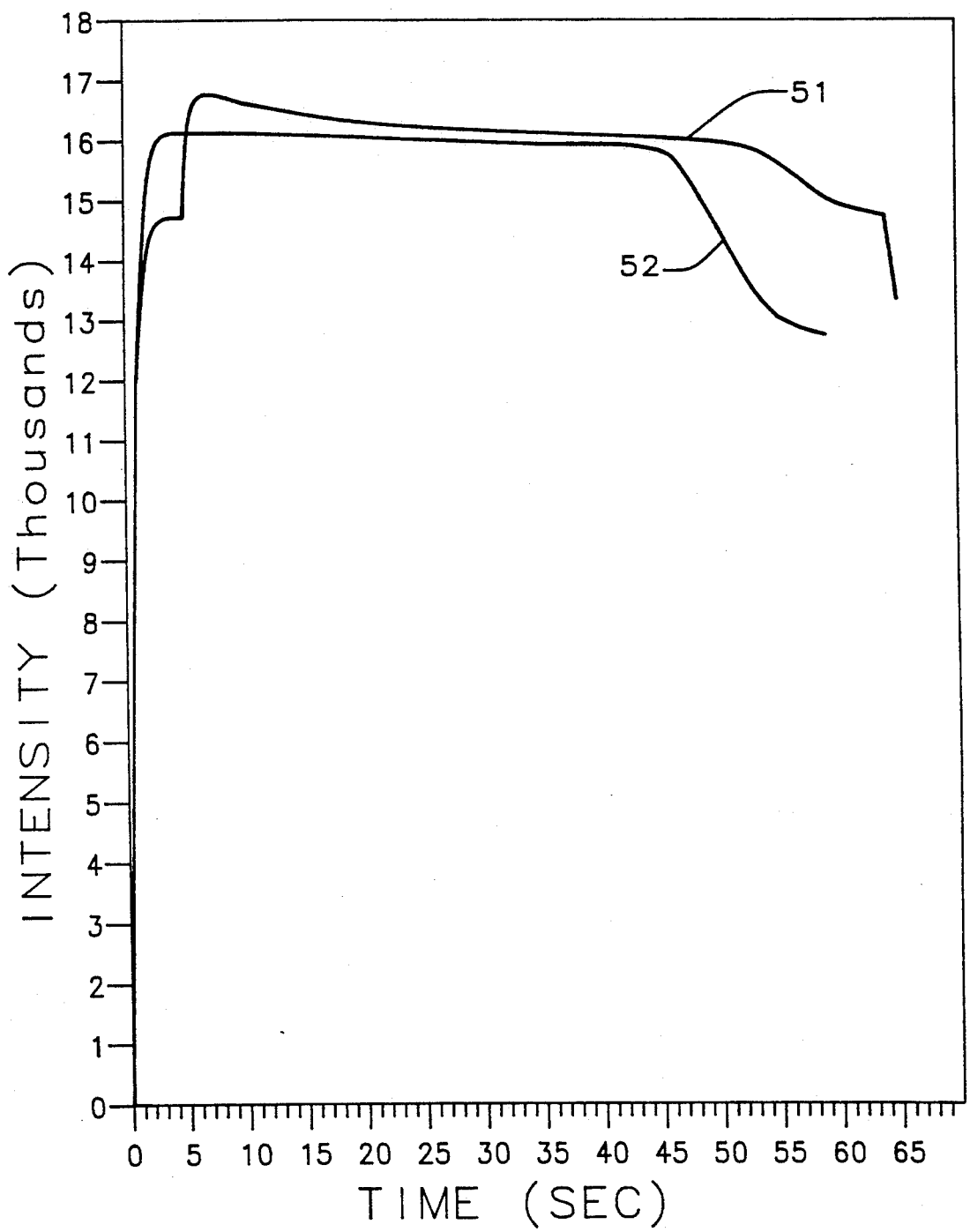
FIG. 12 graphically illustrates a comparison between the endpoint signals of the conventional process and the spacer etching process of this invention.

FIG. 12 shows the improved endpoint detection while using the cap nitride process of the present invention. Line 51 illustrates the spacer endpoint signal for the conventional process without nitride cap layer 20. Line 52 illustrates spacer endpoint signal for tile process of the present invention using the nitride cap layer 20. This graph shows that the best endpoint signal resulted from the experiment wherein there was a nitride cap, layer 20 in previous figures. This effective endpoint drop makes dry etching endpoint detection more reliable and controllable.

While the invention has been particularly shown and described with reference to the preferred embodiments thereof, it will be understood by those skilled in the art that various changes in form and details may be made without departing from the spirit and scope of the invention.

What is claimed is:

1. The method of fabricating an integrated circuit having a combination of a capacitor and metal oxide semiconductor field effect transistor with gate electrodes and source/drain regions comprising:

providing field oxide regions formed on a silicon substrate to isolate surface regions of silicon from one another and the regions having one conductivity;

depositing a doped polysilicon layer on top of said field oxide regions and said isolated surface regions;

forming a first silicon oxide layer on top of said doped polysilicon layer;

depositing a first silicon nitride barrier layer or first silicon oxynitride barrier layer on top of said first silicon oxide layer;

forming an opening having substantially vertical sidewalls through said first silicon nitride layer or first silicon oxynitride barrier layer and said first silicon oxide layer to said doped polysilicon layer in the planned said capacitor;

forming said gate electrodes on said surface regions and the pattern of said capacitor on said field oxide regions by etching openings with substantially vertical sidewalls in said silicon oxide, silicon nitride or silicon oxynitride, and polysilicon layers using a lithography mask;

ion implanting lightly doped said source/drain regions of an opposite conductivity into said surface regions of silicon having said one conductivity;

depositing a second layer of silicon dioxide over the exposed surfaces;

anisotropically etching said second silicon dioxide layer to form spacers on said substantially vertical sidewalls whereby said first silicon nitride barrier layer aids in etch endpoint detection;

growing a polysilicon oxide layer on top of the exposed said doped polysilicon layer to form plate of said capacitor;

ion implanting said opposite conductivity impurities into said surface regions of silicon to form heavily doped said source/drain regions adjacent to said gate electrode;

depositing a second barrier layer of silicon nitride or silicon oxynitride over the exposed surfaces;

depositing a layer of dielectric material over said second barrier layer of silicon nitride layer or silicon oxynitride layer;

forming openings through said layer of dielectric material in all areas but that which covers said planned capacitor;

etching the remaining exposed said second barrier layer of silicon nitride silicon oxynitride to expose said source/drain regions;

etching the remains of said dielectric material covering said planned capacitor;

forming the dielectric of said capacitor; and depositing and patterning a metal layer to form the top metal electrode of said capacitor and contacts to said source/drain regions of said integrated circuit.

2. The process of claim 1 wherein said doped polysilicon layer is between about 2000 to 5000 Angstroms thick and is doped with phosphorus oxychloride, phosphorus, boron, or arsenic.

3. The process of claim 1 wherein said first silicon oxide layer has a thickness of between about 500 to 2700 Angstroms.

4. The process of claim 1 wherein said silicon nitride barrier layer has a thickness of between about 300 to 3000 Angstroms.

5. The process of claim 1 wherein the combined thickness of said first silicon oxide and said silicon nitride barrier layer is between about 2000 and 5000 Angstroms.

6. The process of claim 1 wherein said second silicon oxide layer has a thickness of between about 500 and 3000 Angstroms.

7. The process of claim 1 wherein said polysilicon oxide layer has a thickness of between about 100 and 700 Angstroms.

8. The process of claim 1 wherein the thickness of said second silicon nitride barrier layer is between about 100 to 700 Angstroms.

9. The method of fabricating an integrated circuit having a metal oxide semiconductor field effect transistor with gate electrodes and source/drain regions comprising:

providing field oxide regions formed on a silicon substrate to isolate surface regions of silicon from one another and the regions having one conductivity;

depositing a doped polysilicon layer on top of said field oxide regions and said isolated surface regions;

forming a first silicon oxide layer on top of said doped polysilicon layer;

depositing a first silicon nitride barrier layer on top of said silicon oxide layer;

forming said gate electrodes on said surface regions by etching openings with substantially vertical sidewalls in said silicon oxide, silicon nitride, and polysilicon layers using a lithography mask;

ion implanting lightly doped said source/drain regions of an opposite conductivity into said surface regions of silicon having said one conductivity while using the said gate electrode as a mask;

depositing a second layer of silicon dioxide over the exposed surfaces;

anisotropically etching said second silicon dioxide layer to form spacers on said substantially vertical sidewalls whereby said silicon nitride barrier layer aids in etch endpoint detection;

forming a third silicon oxide layer on the exposed said surface regions;

ion implanting said opposite conductivity impurities into said surface regions of silicon to form heavily doped said source/drain regions adjacent to said spacers on said gate electrode;

depositing a second barrier layer of silicon nitride over the exposed surfaces;

depositing a layer of dielectric material over said second barrier layer of silicon nitride;

etching the said dielectric layer in the desired pattern and the exposed said second silicon nitride layer to expose said source/drain regions; and depositing and patterning a metal layer to form the contacts to said source/drain regions of said integrated circuit.

10. The process of claim 9 wherein said silicon nitride barrier layer has a thickness of between about 300 to 3000 Angstroms.

11. The process of claim 9 wherein the combined thickness of said first silicon oxide and said silicon nitride barrier layer is between about 2000 and 5000 Angstroms.

12. The process of claim 9 wherein said second silicon oxide layer has a thickness of between about 500 and 3000 Angstroms.

13. The process of claim 9 wherein said transistor is formed simultaneously with a capacitor, said capacitor is formed on said field oxide regions.

* * * * *